(12) United States Patent
Liao et al.

(10) Patent No.: US 8,237,157 B2
(45) Date of Patent: Aug. 7, 2012

(54) FLUOROCARBON ELECTRODE MODIFICATION LAYER

(75) Inventors: Liang-Sheng Liao, Rochester, NY (US);
Myron W. Culver, Rochester, NY (US);
Ching W. Tang, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 164 days.

(21) Appl. No.: 12/861,654

(22) Filed: Aug. 23, 2010

(65) Prior Publication Data

US 2011/0203667 A1 Aug. 25, 2011

Related U.S. Application Data

(62) Division of application No. 11/339,292, filed on Jan. 25, 2006, now Pat. No. 7,799,439.

(51) Int. Cl.
*H01L 51/44* (2006.01)
*H01L 51/10* (2006.01)
*H01L 51/48* (2006.01)
*H01L 51/40* (2006.01)

(52) U.S. Cl. ........... 257/40; 257/E51.005; 257/E51.012; 313/504; 313/506

(58) Field of Classification Search .................. None
See application file for complete search history.

(56) References Cited

U.S. PATENT DOCUMENTS

| | | | |
|---|---|---|---|
| 4,356,429 A | 10/1982 | Tang | |
| 4,720,432 A | 1/1988 | VanSlyke et al. | |
| 5,256,945 A | 10/1993 | Imai et al. | |
| 6,127,004 A | 10/2000 | Hatwar et al. | |
| 6,208,075 B1 | 3/2001 | Hung et al. | |
| 6,423,429 B2 | 7/2002 | Kido et al. | |
| 6,720,573 B2 | 4/2004 | Son et al. | |
| 7,282,735 B2 * | 10/2007 | Wu et al. | 257/40 |
| 7,799,439 B2 * | 9/2010 | Liao et al. | 428/690 |
| 7,924,356 B2 * | 4/2011 | Kamijima et al. | 349/43 |
| 2004/0113547 A1 | 6/2004 | Son et al. | |
| 2005/0110398 A1 * | 5/2005 | Lee | 313/504 |
| 2005/0274961 A1 * | 12/2005 | Iou | 257/82 |
| 2005/0287721 A1 * | 12/2005 | Yamamoto et al. | 438/149 |

FOREIGN PATENT DOCUMENTS

| | | |
|---|---|---|
| EP | 0 891 121 | 1/1999 |
| EP | 1 029 909 | 8/2000 |

OTHER PUBLICATIONS

"Highly efficient phosphorescence from organic light-emitting devices with an exciton-block layer", Applied Physics Letters, vol. 79, No. 2, Jul. 9, 2001, pp. 156-158.
"Fluorinated Fullernes: Synthesis, Structure, and Properties", J.AM. chem. Soc. 1993, 115, 6060-6064, Kniaz et al.
"Synthesis and spectroscopic study of fluorinated fullerene", C 60, Journal of Fluorine Chemistry 78 (1996) 7-13, Matsuo et al.
"Electronic Structures & Chemical Bonding of fluorinated Fullernes Studied by NEXAFS, UPS, and Vacuum-UV Absorption Spectroscopies", The Journal of Physical Chemistry A, Mitsumoto et al., (1998) pp. 552-560.

* cited by examiner

*Primary Examiner* — Dawn L. Garrett
(74) *Attorney, Agent, or Firm* — McKenna Long & Aldridge LLP

(57) ABSTRACT

An organic device including at least two electrodes; at least one organic active layer, wherein the organic active layer is disposed in between two electrodes; and an electrode modification layer, wherein the electrode modification layer is disposed in between two electrodes and in contact with one of the electrodes; and the electrode modification layer includes a fluorocarbon compound selected from the materials having a chemical structure of $(C_xF_y)_n$, wherein the "x", "y", and "n" are integers, and wherein $1<x\leq70$, $1<y\leq50$, and $n\geq1$.

5 Claims, 4 Drawing Sheets

FLUOROCARBON ELECTRODE MODIFICATION LAYER

This application is a Divisional of prior application Ser. No. 11/339,292, filed Jan. 25, 2006, which is hereby incorporated by reference in its entirety as if fully set forth herein.

FIELD OF INVENTION

This invention relates to organic devices including organic electronic devices and organic opto-electronic devices. More specifically, this invention relates to organic devices using an improved electrode modification layer made of thermally evaporable fluorocarbon materials.

BACKGROUND OF THE INVENTION

Organic devices include organic electronic devices and organic opto-electronic devices. Organic electronic devices are devices having an organic active layer to control electron flows in the devices, such as organic thin film transistors. Organic opto-electronic devices have an organic active layer either to convert photon energy into electron energy or to convert electron energy into photon energy. Examples of opto-electronic devices are organic solar cells, organic photodetectors, and organic light-emitting diodes (OLEDs). Organic devices are becoming increasingly desirable for many potential applications. For example, OLEDs, as described by Tang in commonly assigned U.S. Pat. No. 4,356,429, are commercially attractive because they offer the promise of low cost fabrication of high density pixel displays exhibiting bright electroluminescence (EL) with long lifetime, high luminous efficiency, low drive voltage, and wide color range.

A typical OLED includes two electrodes and one organic EL unit disposed between the two electrodes. The organic EL unit commonly includes an organic hole-transporting layer (HTL), an organic light-emitting layer (LEL), and an organic electron-transporting layer (ETL). One of the electrodes is the anode, which is capable of injecting positive charges (holes) into the HTL of the EL unit. The other electrode is the cathode, which is capable of injecting negative charges (electrons) into the ETL of the EL unit. When the anode is biased with a certain positive electrical potential relative to the cathode, holes injected from the anode and electrons injected from the cathode can recombine and emit light from the LEL.

In order to facilitate hole injection from the anode into the HTL, thereby reducing the drive voltage of the OLEDs, it is often useful to provide a hole-injecting layer (HIL) in the organic EL unit. Suitable materials for use in HIL include porphyrinic compounds as described by VanSlyke et al. in U.S. Pat. No. 4,720,432, such as copper phthalocyanine (CuPc). Suitable materials for use in HIL also include some aromatic amines as described by Imai et al. in U.S. Pat. No. 5,256,945, such as 4,4',4"-tris[(3-ethylphenyl)phenylamino] triphenylamine (m-TDATA). Alternative hole-injecting materials reportedly useful in OLEDs are described in EP 0 891 121 A1, EP 1 029 909 A1, U.S. Pat. No. 6,423,429, U.S. Pat. No. 6,720,573, and U.S. Patent Application Publication 2004/0113547 A1.

Moreover, in order to have an improved hole injection and improved electroluminescence (EL) performance in OLEDs, Hung et al. in U.S. Pat. No. 6,208,075 B1 and Hatwar et al. in U.S. Pat. No. 6,127,004 disclosed a method of forming a fluorocarbon polymer layer as an HIL layer (or as an electrode modification layer) on an indium-tin-oxide (ITO) anode surface. The fluorocarbon polymer layer contains a $CF_x$ as a repeating unit, and is denoted as $(CF_x)_n$ layer, wherein "x" and "n" are integers, x<4 and n>1. The $(CF_x)_n$ layer is formed by a plasma treatment in a vacuum chamber containing $CHF_3$ gas. The OLEDs containing $(CF_x)_n$ layer on the anode surface do exhibit improved voltage performance and operational lifetime.

Although $(CF_x)_n$ layer is an excellent HIL or electrode modification layer, it needs a separated plasma deposition chamber to prepare this $(CF_x)_n$ layer and it is difficult to form this $(CF_x)_n$ layer with identical thickness from one substrate to another substrate causing drive voltage deviation from one device to another device. Moreover, in some cases, this $(CF_x)_n$ layer is contaminated when exposed to air during the transfer of the substrate to another deposition chamber for organic layer deposition.

In order to simplify the fabrication of organic devices, to improve manufacturing capability, and to enhance device performance, it is necessary to find an improved fluorocarbon compound layer as an electrode modification layer in the devices.

SUMMARY OF THE INVENTION

It is therefore an object of the present invention to simplify the fabrication of organic devices.

It is another object of the present invention to improve manufacturing capability of organic devices.

It is yet another object of the present invention to enhance performance of organic devices.

These objects are achieved by an organic device, comprising:
  a) at least two electrodes;
  b) at least one organic active layer, wherein the organic active layer is disposed in between two electrodes; and
  c) an electrode modification layer, wherein:
    i) the electrode modification layer is disposed in between two electrodes and in contact with one of the electrodes; and
    ii) the electrode modification layer includes a fluorocarbon compound selected from the materials having a chemical structure of $(C_xF_y)_n$, wherein the "x", "y", and "n" are integers, and wherein $1<x\leq70$, $1<y\leq50$, and $n\geq1$.

The present invention makes use of a class of fluorocarbon compounds that can effectively form an electrode modification layer in contact with an electrode in organic devices. It is another advantage of the present invention that the fabrication of the organic devices, especially that of the OLEDs, can be simplified using thermal evaporation method instead of the plasma treatment. It is another advantage of the present invention that the manufacturing capability can be improved. It is yet another advantage of the present invention that the device performance can be maintained or enhanced.

It will be understood that FIGS. 1-5 are not to scale since the individual layers are too thin and the thickness differences of various layers are too great to permit depiction to scale.

DETAILED DESCRIPTION OF THE INVENTION

The present invention is employed in most organic device configurations. These include from very simple structures including two electrodes and one organic layer to more complex devices, such as passive matrix displays including orthogonal arrays of electrodes and more than one organic layers to form pixels. There are numerous configurations of the organic layers wherein the present invention is successfully practiced. The essential requirements of an organic device are at least two electrodes and one organic active layer disposed in between two electrodes.

Figure 1:
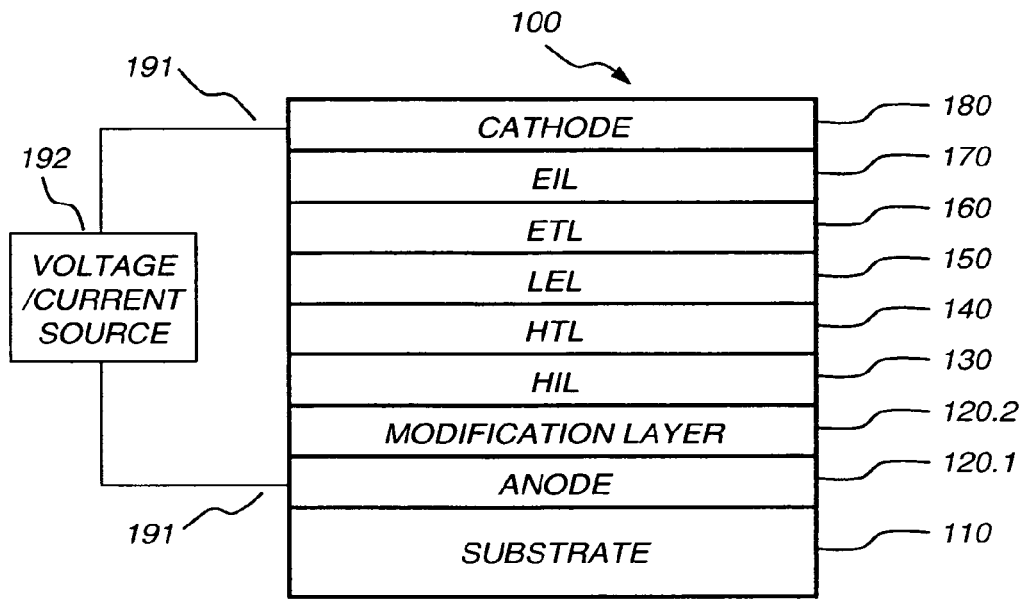
FIG. 1 shows a cross-sectional view of one embodiment of an OLED prepared in accordance with the present invention.
Figure 2:
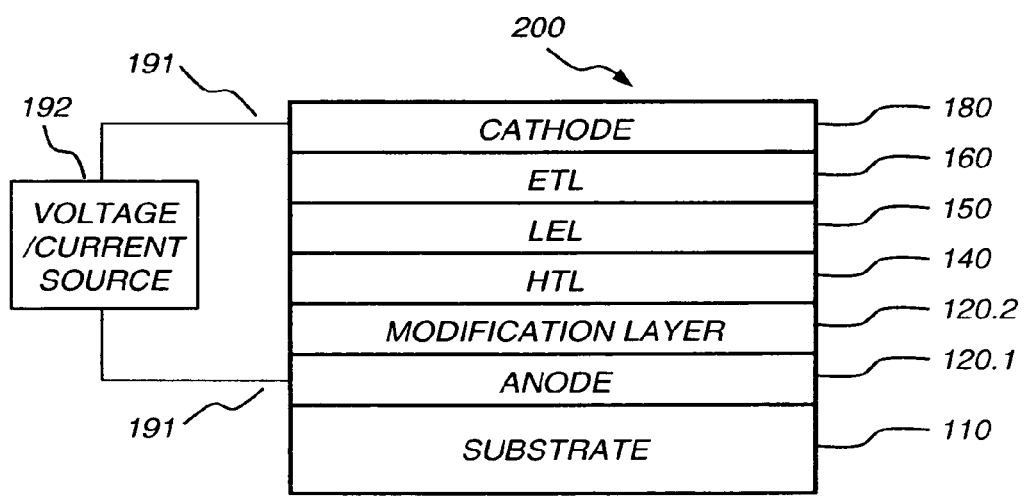
FIG. 2 shows a cross-sectional view of another embodiment of an OLED prepared in accordance with the present invention.

There is shown a cross-sectional view of one embodiment of an OLED in accordance with the present invention in FIG. 1. OLED 100 includes substrate 110, anode 120.1, electrode modification layer 120.2 (denoted as "modification layer" in the figure), HIL 130, HTL 140, LEL 150, ETL 160, EIL 170, and cathode 180. (Modification layer 120.2, HIL 130, HTL 140, LEL 150, ETL 160, and EIL 170 form an organic EL unit in between the anode 120.1 and cathode 180). OLED 100 is externally connected to a voltage/current source 192 through electrical conductors 191. OLED 100 is operated by applying an electric potential produced by the voltage/current source 192 between the pair of contact electrodes, anode 120.1 and cathode 180. FIG. 2 depicts OLED 200, which is another embodiments of OLEDs prepared in accordance with the present invention. OLED 200 in FIG. 2 is the same as OLED 100 except that there is no HIL 130 or EIL 160 in the device.

The following is a description of the device structure, material selection, and fabrication process for the OLED embodiments shown in FIGS. 1-2.

Substrate 110 is an organic solid, an inorganic solid, or include organic and inorganic solids that provides a supporting backplane to hold the OLED 100. Substrate 110 is rigid or flexible and is processed as separate individual pieces, such as sheets or wafers, or as a continuous roll. Typical substrate materials include glass, plastic, metal, ceramic, semiconductor, metal oxide, semiconductor oxide, or semiconductor nitride, or combinations thereof. Substrate 110 is a homogeneous mixture of materials, a composite of materials, or multiple layers of materials. Substrate 110 can also be a backplane containing TFT circuitry commonly used for preparing OLED display, e.g. an active-matrix low-temperature polysilicon TFT substrate. The substrate 110 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore is light transmissive, light absorbing or light reflective. Substrates for use in this case include, but are not limited to, glass, plastic, semiconductor materials, ceramics, and circuit board materials, or any others commonly used in the formation of OLEDs, which are either passive-matrix devices or active-matrix devices.

Anode 120.1 is formed over substrate 110 in FIGS. 1 and 2. When EL emission is viewed through the substrate 110, the anode 120.1 should be transparent or substantially transparent to the emission of interest. For applications where EL emission is viewed through the top electrode, the transmissive characteristics of the anode material are immaterial and any conducting or semiconducting material is used, regardless if it is transparent, opaque or reflective. Desired anode materials are deposited by any suitable way such as thermal evaporation, sputtering, chemical vapor deposition, or electrochemical means. Anode materials are patterned using well known photolithographic processes.

The material for use to form anode 120.1 is selected from inorganic materials, or organic materials, or combination thereof. The anode 120.1 can contain the element material selected from aluminum, silver, gold, copper, zinc, indium, tin, titanium, zirconium, hafnium, niobium, tantalum, molybdenum, tungsten, manganese, iron, ruthenium, rhodium, iridium, nickel, palladium, platinum, silicon, or germanium, or combinations thereof. The anode 120.1 can also contain a compound material, such as a conducting or semiconducting compound. The conducting or semiconducting compound is selected from the oxides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound is selected from the sulfides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound is selected from the selenides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound is selected from the tellurides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound is selected from the nitrides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. Preferably, the conducting or semiconducting compound is selected from indium-tin oxide, tin oxide, aluminum-doped zinc oxide, indium-doped zinc oxide, magnesium-indium oxide, nickel-tungsten oxide, zinc sulfide, zinc selenide, or gallium nitride, or combinations thereof.

The as-prepared anode 120.1 may not be well conditioned as a good electrode without surface modification. Therefore, electrode modification layer 120.2 is necessary for improving device performance.

The electrode modification layer 120.2 is a unique layer of the present invention. The electrode modification layer 120.2 includes a fluorocarbon compound selected from the materials having a chemical structure of $(C_xF_y)_n$, wherein the "x", "y", and "n" are integers, and wherein $1<x\leq70$, $1<y\leq50$, and $n\geq1$. When "n" equal to 1 in the chemical structure of $(C_xF_y)_n$, the fluorocarbon compound is a small molecule material, and when "n" is more than 1 in the chemical structure of $(C_xF_y)_n$, the fluorocarbon compound can be a polymer material. Specifically, the electrode modification layer 120.2 can include a fluorocarbon compound selected from $C_6F_{12}$, $C_6F_{14}$, $C_7F_{14}$, $C_7F_{16}$, $C_{11}F_{20}$, $C_{12}F_{10}$, $C_{13}F_{28}$, $C_{15}F_{32}$, $C_{20}F_{42}$, or $C_{24}F_{50}$. Preferably, the electrode modification layer 120.2 can include a fluorocarbon compound selected from $C_{60}F_{18}$, $C_{60}F_{22}$, $C_{60}F_{30}$, $C_{60}F_{36}$, $C_{60}F_{40}$, $C_{60}F_{42}$, $C_{60}F_{48}$, $C_{70}F_{11}$, or $C_{70}F_{15}$.

Unlike the $(CF_x)_n$ layer (x<4, n>1) which is formed using plasma treatment, the electrode modification layer 120.2 can be formed through a vapor-phase method such as thermal evaporation method, and it can also be formed from a fluid, for example, from a solvent with an optional binder to improve film formation. If the fluorocarbon compound is a polymer, solvent deposition is useful but other methods can be used, such as thermal transfer from a donor sheet. If the fluorocarbon compound is a thermally evaporable solid, the solid can be deposited by thermal evaporation from an evaporation "boat" in an evaporation chamber, e.g., as described in U.S. Pat. No. 6,237,529. After providing heat on the boat containing the fluorocarbon compound solid, an electrode modification layer can be formed.

The thickness of the electrode modification layer 120.2 is in the range of from 0.1 nm to 30 nm, preferably, in the range of from 0.1 nm to 10 nm.

Although it is not always necessary, it is often useful to provide an HIL in the organic EL unit. HIL 130 in the OLEDs can serve to facilitate hole injection from the anode 120.1 into the HTL 130, thereby reducing the drive voltage of the OLEDs. Suitable materials for use in HIL 130 include, but are not limited to, porphyrinic compounds as described in U.S. Pat. No. 4,720,432 and some aromatic amines, for example, 4,4',4"-tris[(3-ethylphenyl)phenylamino]triphenylamine (m-TDATA). Alternative hole-injecting materials reportedly useful in organic EL devices are described in EP 0 891 121 A1 and EP 1 029 909 A1. Aromatic tertiary amines discussed below can also be useful as hole-injecting materials. Other useful hole-injecting materials such as dipyrazino[2,3-f:2',3'-h]quinoxalinehexacarbonitrile are described in U.S. Patent Application Publication 2004/0113547 A1 and U.S. Pat. No. 6,720,573. In addition, a p-type doped organic layer is also useful for the HIL as described in U.S. Pat. No. 6,423,429. The term "p-type doped organic layer" means that this layer has semiconducting properties after doping, and the electrical current through this layer is substantially carried by the holes. The conductivity is provided by the formation of a charge-transfer complex as a result of hole transfer from the dopant to the host material. The thickness of the HIL 130 is in the range of from 0.1 nm to 200 nm, preferably, in the range of from 0.5 nm to 150 nm.

The HTL 140 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or at least one active hydrogen-containing group are disclosed by Brantley, et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A:

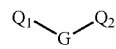

wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B

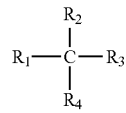

wherein:

$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural Formula C

wherein $R_5$ and $R_6$ are independently selected aryl groups. In one embodiment, at least one of $R_5$ or $R_6$ contains a polycyclic fused ring structure, e.g., anaphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

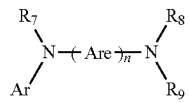

wherein:

each Are is an independently selected arylene group, such as a phenylene or anthracene moiety;

n is an integer of from 1 to 4; and

Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, and D can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The HTL is formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron injecting and transporting layer. Aromatic tertiary amines are useful as hole injection materials also. Illustrative of useful aromatic tertiary amines are the following:

1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;
2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;
2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4"-bis[N-(1-anthryl)-N-phenylamino]-p-terphenyl;
4,4'-bis[N-(1-coronenyl)-N-phenylamino]biphenyl;
4,4'-bis[N-(1-naphthyl)-N-phenylamino]biphenyl (NPB);
4,4'-bis[N-(1-naphthyl)-N-(2-naphthyl)amino]biphenyl (TNB);
4,4"-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-bis[N-(2-phenanthryl)-N-phenylamino]biphenyl;
4,4'-bis[N-(2-pyrenyl)-N-phenylamino]biphenyl;
4,4'-bis[N-(3-acenaphthenyl)-N-phenylamino]biphenyl;
4,4'-bis[N-(3-methylphenyl)-N-phenylamino]biphenyl (TPD);
4,4'-bis[N-(8-fluoranthenyl)-N-phenylamino]biphenyl;
4,4'-bis[N-(9-anthryl)-N-phenylamino]biphenyl;
4,4'-bis{N-phenyl-N-[4-(1-naphthyl)-phenyl]amino}biphenyl;
4,4'-bis[N-phenyl-N-(2-pyrenyl)amino]biphenyl;
4,4',4"-tris[(3-methylphenyl)phenylamino]triphenylamine (m-TDATA);
Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-naphthalenyl-[1,1'-biphenyl]-4,4'-diamine;
N,N'-bis[4-(di-1-naphthalenylamino)phenyl]-N,N'-di-1-naphthalenyl-[1,1'-biphenyl]-4,4'-diamine;
N,N'-bis[4-[(3-methylphenyl)phenylamino]phenyl]-N,N'-diphenyl-[1,1'-biphenyl]-4,4'-diamine;
N,N-bis[4-(diphenylamino)phenyl]-N',N'-diphenyl-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl; and
N,N,N',N'-tetra(2-naphthyl)-4,4"-diamino-p-terphenyl.

Another class of useful hole-transporting materials includes polycyclic aromatic compounds as described in EP 1 009 041. Tertiary aromatic amines with more than two amine groups can be used including oligomeric materials. In addition, polymeric hole-transporting materials are used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The thickness of HTL 140 is in the range of from 5 nm to 200 nm, preferably, in the range of from 10 nm to 150 nm.

Typically the LEL 150 includes a luminescent fluorescent or phosphorescent material where electroluminescence is produced as a result of electron-hole pair recombination in this layer. The LEL 150 includes a single material, but more commonly contains at least one host material doped with at least one emitting material. The host material in the LEL 150 is an electron-transporting, hole-transporting, or another material or combination of materials that support hole-electron recombination. The emitting material is often referred to as a dopant. The dopant is typically chosen from highly fluorescent dyes and phosphorescent compounds, e.g., transition metal complexes as described in WO 98/55561, WO 00/18851, WO 00/57676, and WO 00/70655. Dopant materials are typically incorporated at 0.01 to 20% level by volume of the host material.

Host and dopants known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; 6,020,078; 6,475,648; 6,534,199; 6,661,023, U.S. Patent Application Publications 2002/0127427 A1; 2003/0198829 A1; 2003/0203234 A1; 2003/0224202 A1, and 2004/0001969 A1.

One class of host materials includes metal complexes of 8-hydroxyquinoline (oxine) and similar derivatives capable of supporting electroluminescence. Exemplary of contemplated oxinoid compounds are those satisfying structural Formula E

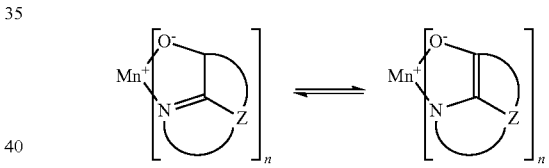

wherein:
M represents a metal;
n is an integer of from 1 to 4; and
Z independently in each occurrence represents the atoms completing a nucleus having at least two fused aromatic rings.

Another class of useful host materials includes derivatives of anthracene, such as those described in U.S. Pat. Nos. 5,935,721; 5,972,247; 6,465,115; 6,534,199; 6,713,192, U.S. Patent Application Publications 2002/0048687 A1, 200/30072966 A1, and WO 2004018587. Common examples include 9,10-bis(2-naphthalenyl)anthracene (AD-N), 2-(1,1-dimethyethyl)-9,10-bis(2-naphthalenyl)anthracene (TBADN). Other examples include different derivatives of AD-N, such as those represented by Formula F

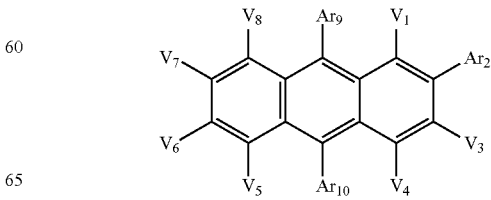

wherein:

Ar$_2$, Ar$_9$, and Ar$_{10}$ independently represent an aryl group;
v$_1$, v$_3$, v$_4$, v$_5$, v$_6$, v$_7$, and v$_8$ independently represent hydrogen or a substituent;
and Formula G

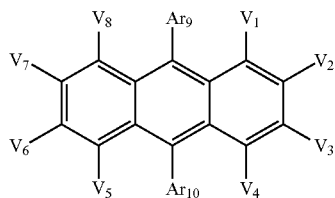

wherein:

Ar$_9$, and Ar$_{10}$ independently represent an aryl group;
v$_1$, v$_2$, v$_3$, v$_4$, v$_5$, v$_6$, v$_7$, and v$_8$ independently represent hydrogen or a substituent.

Yet another class of host materials includes rubrene and other tetracene derivatives. Some examples are represented by Formula H

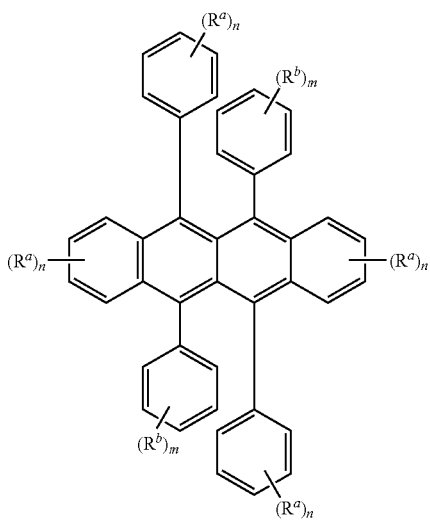

wherein:

R$^a$ and R$^b$ are substituent groups;
n is selected from 0-4; and
m is selected from 0-5.

Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Suitable host materials for phosphorescent dopants are selected so that the triplet exciton is transferred efficiently from the host material to the phosphorescent material. For this transfer to occur, it is a highly desirable condition that the excited state energy of the phosphorescent material be lower than the difference in energy between the lowest triplet state and the ground state of the host. However, the bandgap of the host should not be chosen so large as to cause an unacceptable increase in the drive voltage of the OLEDs. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Desirable host materials are capable of forming a continuous film. The LEL can contain more than one host material in order to improve the device's film morphology, electrical properties, light emission efficiency, and operational lifetime. Mixtures of electron-transporting and hole-transporting materials are known as useful hosts. In addition, mixtures of the above listed host materials with hole-transporting or electron-transporting materials can make suitable hosts.

For efficient energy transfer from the host to the dopant material, a necessary condition is that the bandgap of the dopant is smaller than that of the host material. For phosphorescent emitters (including materials that emit from a triplet excited state, i.e. so-called "triplet emitters") it is also important that the triplet energy level of the host be high enough to enable energy transfer from host to dopant material.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane boron compounds, derivatives of distyrylbenzene and distyrylbiphenyl, and carbostyryl compounds. Among derivatives of distyrylbenzene, particularly useful are those substituted with diarylamino groups, also known as distyrylamines. Illustrative examples of useful materials include, but are not limited to, the following:

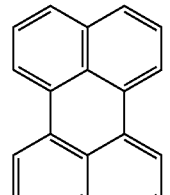

L1

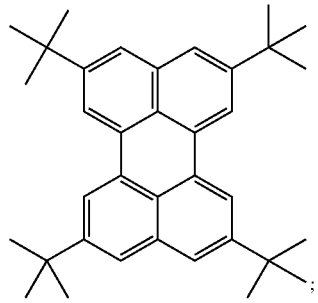

L2

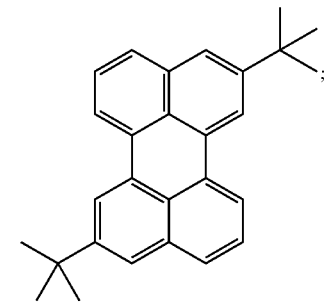
L3
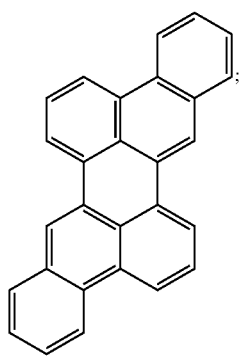
L4
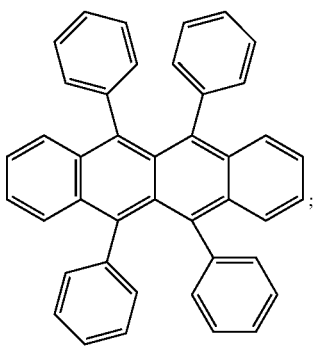
L5
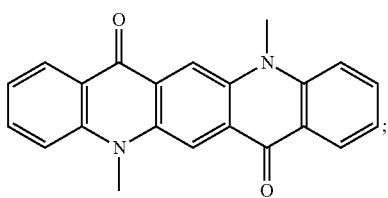
L6
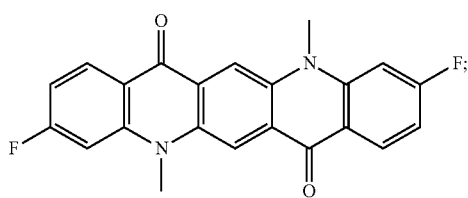
L7
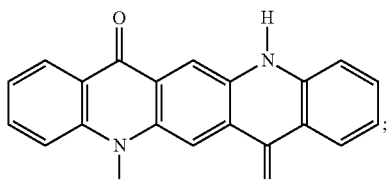
L8
|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl; |
|  | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl; |

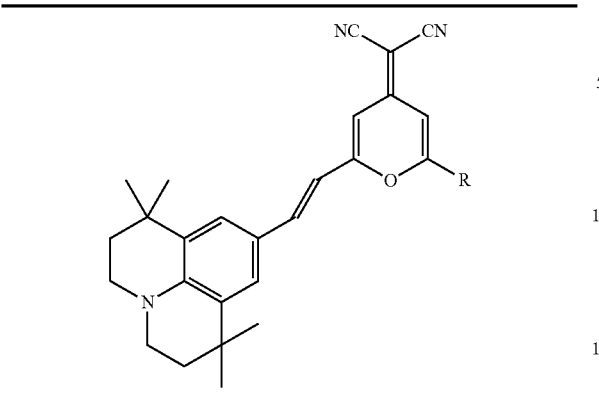
| | R |
|---|---|
| L37 | phenyl |
| L38 | methyl |
| L39 | t-butyl |
| L40 | mesityl; |
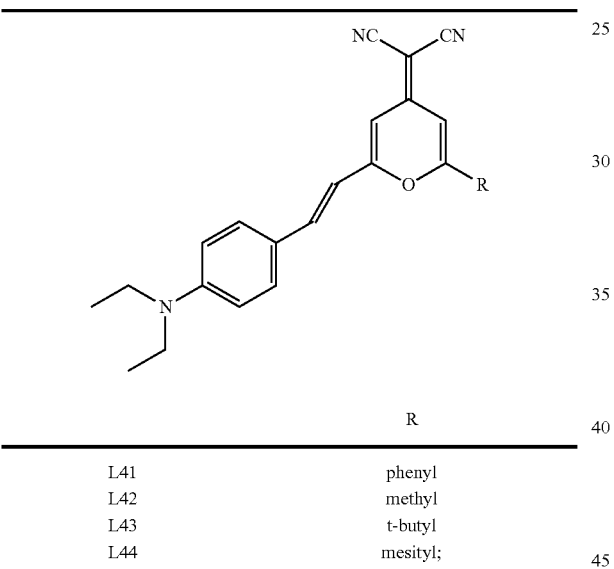
| | R |
|---|---|
| L41 | phenyl |
| L42 | methyl |
| L43 | t-butyl |
| L44 | mesityl; |
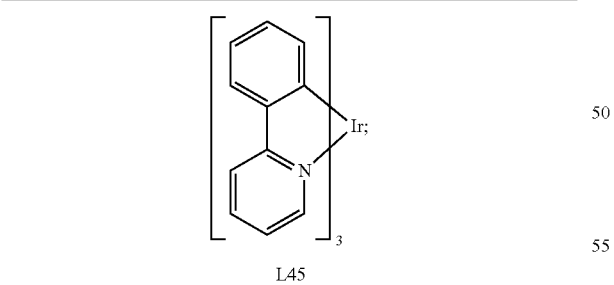
L45
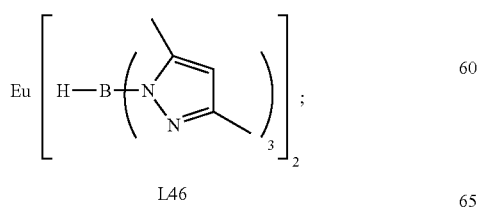
L46
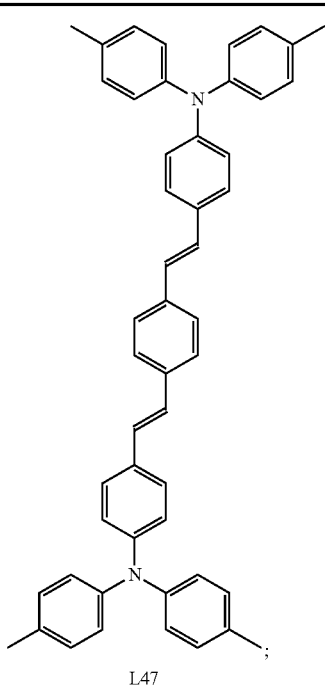
L47
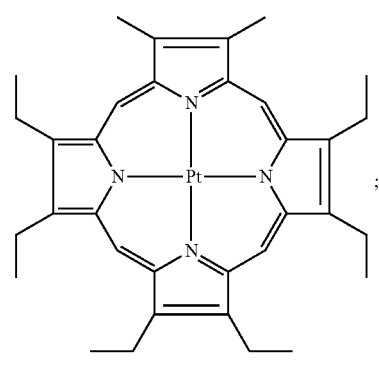
L48
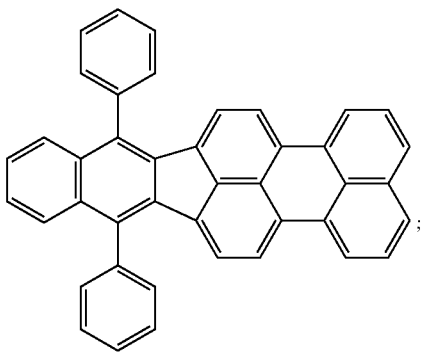
L49

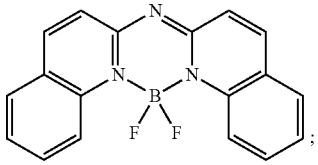

L50

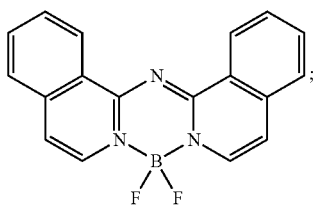

L51

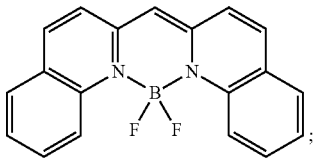

L52

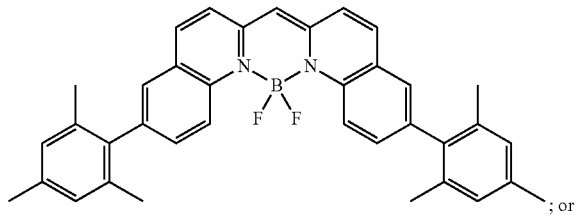

L53

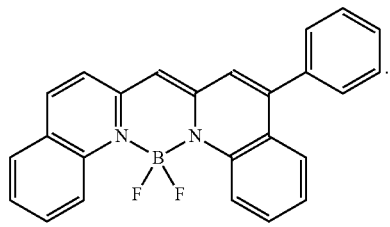

L54

Examples of useful phosphorescent dopants that are used in light-emitting layers of this invention include, but are not limited to, those described in WO 00/57676, WO 00/70655, WO 01/41512 A1, WO 02/15645 A1, WO 02/071813 A1, WO 01/93642 A1, WO 01/39234 A2, WO 02/074015 A2, U.S. Pat. Nos. 6,458,475; 6,573,651; 6,451,455; 6,413,656; 6,515,298; 6,451,415; 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, and EP 1 244 155 A2. Preferably, the useful phosphorescent dopants include transition metal complexes, such as iridium and platinum complexes.

The host and dopant are small nonpolymeric molecules or polymeric materials including polyfluorenes and polyvinylarylenes (e.g., poly(p-phenylenevinylene), PPV). In the case of polymers, a small molecule dopant is molecularly dispersed into a polymeric host, or the dopant is added by copolymerizing a minor constituent into a host polymer.

In some cases it is useful for one or more of the LELs within an EL unit to emit broadband light, for example white light. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823; 5,503,910; 5,405,709; 5,283,182; 6,627,333; 6,696,177; 6,720,092; U.S. Patent Application Publications 2002/0186214 A1, 2002/0025419 A1, and 2004/0009367 A1. In some of these systems, the host for one light-emitting layer is a hole-transporting material. For example, it is known in the art that dopants are added to the HTL 140, thereby enabling HTL 140 to serve as a host. The thickness of each LEL is in the range of from 5 nm to 50 nm, preferably, in the range of from 10 nm to 40 nm.

Preferred organic materials for use in forming the ETL 160 in the organic EL unit is metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

(The oxinoid compounds can be used as both the host material in LEL 150 and the electron-transporting material in ETL 160).

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

The EIL 170 in the organic EL unit is an n-type doped layer containing at least one electron-transporting material as a host material and at least one n-type dopant (This EIL can also be called an n-type doped EIL 170). The term "n-type doped layer" means that this layer has semiconducting properties after doping, and the electrical current through this layer is substantially carried by the electrons. The host material is capable of supporting electron injection and electron transport. The electron-transporting materials used in ETL 160 represent a useful class of host materials for the n-type doped EIL 170. Preferred materials are metal chelated oxinoid compounds, including chelates of oxine itself, such as tris(8- hydroxyquinoline)aluminum (Alq). Other materials include various butadiene derivatives as disclosed by Tang in U.S. Pat. No. 4,356,429, various heterocyclic optical brighteners as disclosed by Van Slyke et al. in U.S. Pat. No. 4,539,507, triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful host organic materials. The combination of the aforementioned host materials is also useful to form the n-typed doped EIL 170. More preferably, the host material in the n-type doped EIL 170 includes Alq, 4,7-diphenyl-1,10-phenanthroline (Bphen), 2,9-dimethyl-4, 7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

Both EIL 170 and ETL 160 in the EL unit in the OLEDs can use the same or different material.

The n-type dopant in the n-type doped EIL 170 includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped EIL 170 also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped EIL 170 includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume. The thickness of the n-type doped EIL 170 is typically less than 200 nm, and preferably in the range of less than 150 nm.

Additional layers such as electron or hole-blocking layers can be employed in the organic EL unit in the OLEDs. Hole-blocking layers are commonly used to improve efficiency of phosphorescent emitter devices, for example, as in U.S. Patent Application Publication 2002/0015859 A1.

In some instances, LEL 150 and ETL 160 in the organic EL unit can optionally be collapsed into a single layer that serves the function of supporting both light emission and electron transportation. It is also known in the art that emitting dopants can be added to the HTL 140, thereby enabling HTL 140 to serve as a host. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in U.S. Patent Application Publication 2002/0025419 A1, U.S. Pat. Nos. 5,683,823; 5,503,910; 5,405,709; 5,283,182; EP 1 187 235, and EP 1 182 244.

Each of the layers (HIL 130, HTL 140, LEL 150, ETL 160, and EIL 170) in the organic EL units in the OLEDs is formed from small molecule (or nonpolymeric) materials (including fluorescent materials and phosphorescent materials), polymeric LED materials, or inorganic materials, or combinations thereof.

The organic materials in the organic EL unit are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often including a tantalum material, e.g., as described in U.S. Pat. No. 6,237,529, or can be first coated onto a donor sheet and then sublimed in closer proximity to the substrate. Layers with a mixture of materials can use separate evaporation boats or the materials can be premixed and coated from a single boat or donor sheet. For full color display, the pixelation of LELs may be needed. This pixelated deposition of LELs can be achieved using shadow masks, integral shadow masks, U.S. Pat. No. 5,294,870, spatially defined thermal dye transfer from a donor sheet, U.S. Pat. Nos. 5,688,551; 5,851,709, and 6,066,357, and inkjet method, U.S. Pat. No. 6,066,357. For other organic layers either in the organic EL units, pixelated deposition is not necessarily needed.

When light emission is viewed solely through the anode, the cathode 180 can include nearly any conductive material. Desirable materials have effective film-forming properties to ensure effective contact with the underlying organic layer, promote electron injection at low voltage, and have effective stability. Useful cathode materials often contain a low work-function metal (<4.0 eV) or metal alloy. One preferred cathode material includes a Mg:Ag alloy wherein the percentage of silver is in the range of 1 to 20%, as described in U.S. Pat. No. 4,885,221. Another suitable class of cathode materials includes bilayers including a thin inorganic EIL (or cathode buffer layer) in contact with an organic layer (e.g., ETL or organic EIL), which is capped with a thicker layer of a conductive metal. Here, the inorganic EIL preferably includes a low work-function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed solely through the anode, the cathode 180 includes nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes a Mg:Ag alloy as described in U.S. Pat. No. 4,885,221. Another suitable class of cathode materials includes bilayers having a thin inorganic EIL in contact with an organic layer (e.g., organic EIL or ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, cathode 180 should be transparent or nearly transparent. For such applications, metals should be thin or one should use transparent conductive oxides, or include these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393, and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, teflon, and alternating inorganic/polymeric layers are known in the art for encapsulation.

Figure 3:
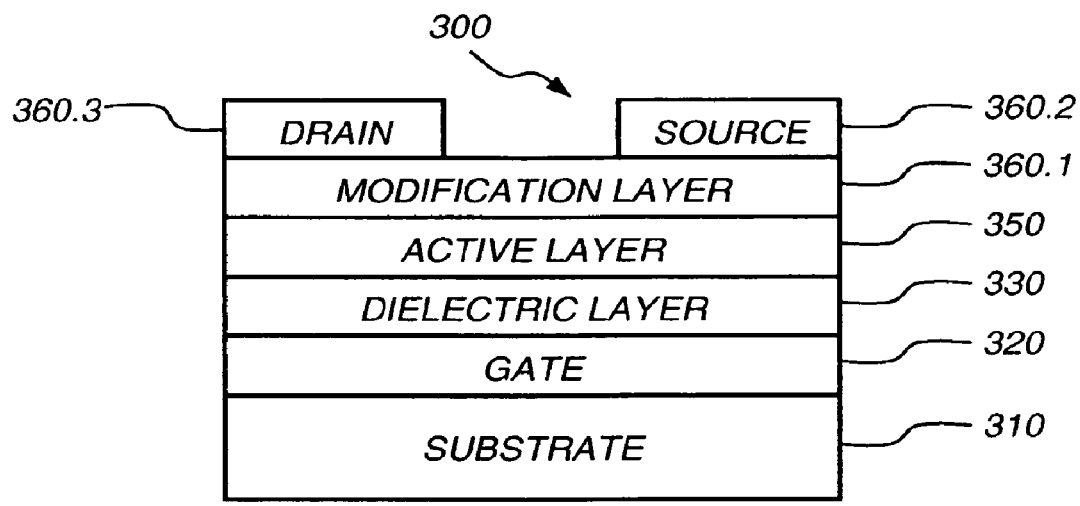
FIG. 3 shows a cross-sectional view of one embodiment of an organic transistor prepared in accordance with the present invention.

There is shown a cross-sectional view of one embodiment of an organic thin film transistor (OTFT) in accordance with the present invention in FIG. 3. An OTFT 300 includes a substrate 310, a gate 320, a dielectric layer 330, an active layer 350, an electrode modification layer (denoted as "modification layer" in the FIG. 360.1, a source electrode 360.2 and a drain electrode 360.3. Generally, OTFT 300 is structurally similar to a silicon transistor. Like a field effect transistor (FET), the OTFT operates on the principle that, when a voltage is applied on gate 320, an electric field is applied on the dielectric layer 330. A current flowing through the OTFT is obtained by applying a voltage between a source electrode 360.2 and a drain electrode 360.3. In this case, the source electrode 360.2 is grounded and supplies electrons or holes. The active layer 350 disposed over the dielectric layer 330 is an organic semiconductor layer. The electron- or hole-distribution in the active layer 350 is controlled by the electric field applied on the dielectric layer 330. The electrode modification layer 360.1 can modify the surfaces of the source electrode 360.2 and the drain electrode 360.3 to reduce the injection barriers.

Substrate 310 is an organic solid, an inorganic solid, or include organic and inorganic solids that provides a supporting backplane to hold the OTFT. Substrate 310 is rigid or flexible and is processed as separate individual pieces, such as sheets or wafers, or as a continuous roll. Typical substrate materials include glass, plastic, metal, ceramic, semiconductor, metal oxide, semiconductor oxide, or semiconductor nitride, or combinations thereof. Substrate 310 is a homogeneous mixture of materials, a composite of materials, or multiple layers of materials.

The gate electrode 320 shown in FIG. 3 is disposed on the substrate 310. The gate electrode 320 may be formed of a metal, a metal alloy, or a metal compound, such as Al, AlNd, or MoW. The gate electrode 320 may be formed by depositing a metal layer, a metal alloy layer, or a metal compound layer using either a thermal evaporation method or a sputtering technique. The thickness of the gate electrode may be greater than 20 nm.

The dielectric layer 330 shown in FIG. 3 is disposed on the gate electrode 320. The dielectric layer 330 may be a silicon oxide film. In addition, the dielectric layer 330 may be formed of $Ta_2O_5$, $Y_2O_3$, $TiO_2$, ferroelectric insulating materials, $PbZr_xTi_{1-x}O_3$(PZT), $Bi_4Ti_3O_{12}$, $BaMgF_4$, $SrBi_2(Ta_{1-x}Nb_x)_2O_9$, $Ba(Zr_{1-x}Ti_x)O_3$(BZT), $BaTiO_3$, $SrTiO_3$ or $Ba_xSr_{1-x}TiO_3$(BST).

The active layer 350 shown in FIG. 3 is disposed on the dielectric layer 330. The active layer 350 is formed using vacuum deposition, preferably thermal evaporation. The active layer 350 is formed of an organic semiconductor material, such as pentacene, oligo-thiophene, poly(alkyl-thiophene), or poly(thienylenevinylene). Preferably, the active layer 350 is formed of pentacene. The active layer 350 is formed with a thickness greater than 50 nm.

The electrode modification layer 360.1 is a unique layer of the present invention. The electrode modification layer 360.1 includes a fluorocarbon compound selected from the materials having a chemical structure of $(C_xF_y)_n$, wherein the "x", "y", and "n" are integers, and wherein $1<x\leq70$, $1<y\leq50$, and $n\geq1$. When "n" equal to 1 in the chemical structure of $(C_xF_y)_n$, the fluorocarbon compound is a small molecule material, and when "n" is more than 1 in the chemical structure of $(C_xF_y)_n$, the fluorocarbon compound can be a polymer material. Specifically, the electrode modification layer 360.1 can include a fluorocarbon compound selected from $C_6F_{12}$, $C_6F_{14}$, $C_7F_{14}$, $C_7F_{16}$, $C_{11}F_{20}$, $C_{12}F_{10}$, $C_{13}F_{28}$, $C_{15}F_{32}$, $C_{20}F_{42}$, or $C_{24}F_{50}$. Preferably, the electrode modification layer 120.2 can include a fluorocarbon compound selected from $C_{60}F_{18}$, $C_{60}F_{22}$, $C_{60}F_{30}$, $C_{60}F_{36}$, $C_{60}F_{40}$, $C_{60}F_{42}$, $C_{60}F_{48}$, $C_{70}F_{11}$, or $C_{70}F_{15}$.

If the fluorocarbon compound is a thermally evaporable solid, the solid can be deposited by thermal evaporation from an evaporation "boat" in an evaporation chamber, e.g., as described in U.S. Pat. No. 6,237,529. After providing heat on the boat containing the fluorocarbon compound solid, the electrode modification layer 360.1 can be formed on the active layer 350.

The thickness of the electrode modification layer 360.1 is in the range of from 0.1 nm to 30 nm, preferably, in the range of from 0.1 nm to 10 nm.

On top of the electrode modification layer 360.1, source electrode 360.2 and drain electrode 360.3 are deposited. The source electrode 360.2 and drain electrode 360.3 may be formed of a metal, a metal alloy, or a metal compound, such as Au, or Ag. The source electrode 360.2 and drain electrode 360.3 may be formed by depositing a metal layer, a metal alloy layer, or a metal compound layer using either a thermal evaporation method or a sputtering technique. The source electrode 360.2 and drain electrode 360.3 can be made of the same or different material. The thickness of the electrodes may be greater than 20 nm.

In a typical OTFT, an electric energy barrier is generated between source (or drain) electrode and the organic active layer due to the difference in the work function of electrode material and the ionization potential of organic material. This electric energy barrier causes carrier injection difficulties, thus increases contact resistance therebetween. In the present invention, contact resistance is reduced and carrier injection is improved by forming the electrode modification layer in contact with the source electrode and the drain electrode.

Figure 4:
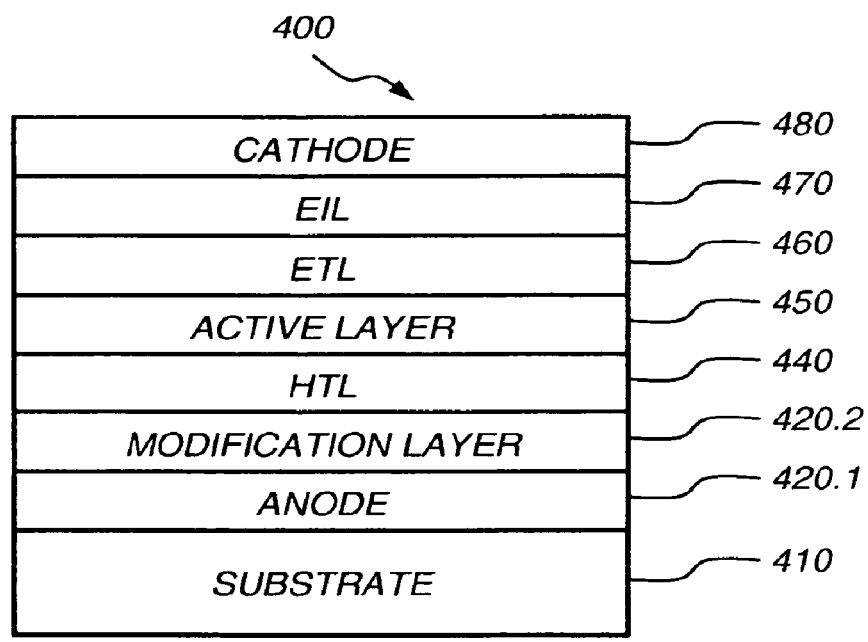
FIG. 4 shows a cross-sectional view of one embodiment of an organic solar cell prepared in accordance with the present invention.
Figure 5:
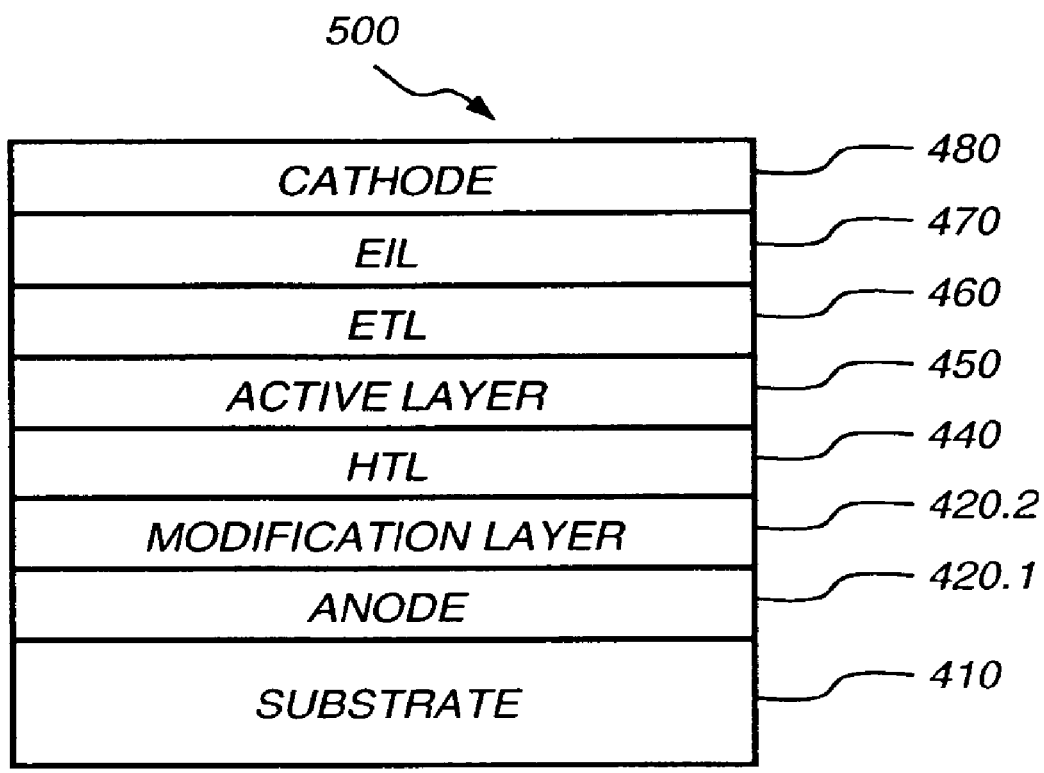
FIG. 5 shows a cross-sectional view of one embodiment of an organic photodetector prepared in accordance with the present invention.

Shown in FIGS. 4 and 5 are the cross-sectional view of one embodiment of solar cells and one embodiment of photodetectors, respectively. Both an organic solar cell 400 and an organic photodetector 500 include a substrate 410, an anode 420.1, an electrode modification layer 420.2 (denoted as "modification layer" in the figures), a HTL 440, an active layer 450, an ETL 460, EIL 470, and a cathode 480. Organic solar cell 400 and organic photodetector 500 typically have the property that when they are irradiated by light they produce a photogenerated voltage or current. Therefore, the photogenerated voltage and current can be used as a power source or a controlling signal.

Substrate 410 is a transparent organic solid, a transparent inorganic solid, or include organic and inorganic solids that provides a transparent supporting backplane to hold the device. Substrate 410 is rigid or flexible and is processed as separate individual pieces, such as sheets or wafers, or as a continuous roll. Typical transparent substrate is selected from glass, plastic, ceramic, semiconductor, metal oxide, semiconductor oxide, or semiconductor nitride, or combinations thereof. Substrate 410 is a homogeneous mixture of materials, a composite of materials, or multiple layers of materials. Transparent glass or plastic are commonly employed as the substrate of the solar cells and the photodetectors.

Anode 420.1 is formed over substrate 410 in FIGS. 4 and 5. Anode 420.1 should be transparent or substantially transparent. Desired anode materials are deposited by any suitable way such as thermal evaporation, sputtering, chemical vapor deposition, or electrochemical means. Anode materials are patterned using well known photolithographic processes. The material for use to form anode 420.1 is selected from inorganic materials, or organic materials, or combination thereof.

The electrode modification layer 420.2 is a unique layer in FIGS. 4 and 5 of the present invention. The electrode modification layer 420.2 includes a fluorocarbon compound selected from the materials having a chemical structure of $(C_xF_y)_n$, wherein the "x", "y", and "n" are integers, and wherein $1<x\leq70$, $1<y\leq50$, and $n\geq1$. When "n" equal to 1 in the chemical structure of $(C_xF_y)_n$, the fluorocarbon compound is a small molecule material, and when "n" is more than 1 in the chemical structure of $(C_xF_y)_n$, the fluorocarbon compound can be a polymer material. Specifically, the electrode modification layer 420.2 can include a fluorocarbon compound selected from $C_6F_{12}$, $C_6F_{14}$, $C_7F_{14}$, $C_7F_{16}$, $C_{11}F_{20}$, $C_{12}F_{10}$, $C_{13}F_{28}$, $C_{15}F_{32}$, $C_{20}F_{42}$, or $C_{24}F_{50}$. Preferably, the electrode modification layer 420.2 can include a fluorocarbon compound selected from $C_{60}F_{18}$, $C_{60}F_{22}$, $C_{60}F_{30}$, $C_{60}F_{36}$, $C_{60}F_{40}$, $C_{60}F_{42}$, $C_{60}F_{48}$, $C_{70}F_{11}$, or $C_{70}F_{15}$.

Unlike the $(CF_x)_n$ layer (x<4, n>1) which is formed using plasma treatment, the electrode modification layer 420.2 can be formed through a vapor-phase method such as thermal evaporation method, and it can also be formed from a fluid, for example, from a solvent with an optional binder to improve film formation. If the fluorocarbon compound is a polymer, solvent deposition is useful but other methods can be used, such as thermal transfer from a donor sheet. If the fluorocarbon compound is a thermally evaporable solid, the solid can be deposited by thermal evaporation from an evaporation "boat" in an evaporation chamber, e.g., as described in U.S. Pat. No. 6,237,529. After providing heat on the boat containing the fluorocarbon compound solid, the electrode modification layer 420.2 can be formed.

The thickness of the electrode modification layer 420.2 is in the range of from 0.1 nm to 30 nm, preferably, in the range of from 0.1 nm to 10 nm.

The HTL 440 may be formed of organic hole-transporting material such as copper phthalocyanine (CuPc). The active layer 450 may be formed of organic material such as C60, CuPc:C60 (1:1 mole ratio), or 3,4,9,10-perylenetetracarboxylic-bis-benzimidazole (PTCBI). The ETL 460 can be formed of organic electron-transporting material such as C60, or PTCBI. The EIL 470 may be formed of organic electron-injecting material such as various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful to form EIL 470. More organic materials for use in HTL 440, active layer 450, ETL 460, and EIL 470 are disclosed, for example, in U.S. Pat. Nos. 5,350,459; 5,652,067; 6,352,777; 6,420,031, and 6,451,415.

The cathode 480 in FIGS. 4 and 5 of the present invention includes nearly any conductive material. Desirable materials have effective film-forming properties to ensure effective contact with the underlying organic layer, promote electron transport and have effective stability. For example, useful cathode materials include, but are not limited to, those disclosed in U.S. Pat. Nos. 5,059,861; 5,059,862, and 6,140,763.

EXAMPLES

The following OLED examples are presented for a further understanding of the present invention. During the fabrication of OLEDs, the thickness of the organic layers and the doping concentrations were controlled and measured in situ using calibrated thickness monitors (INFICON IC/5 Deposition Controller, made by Inficon Inc., Syracuse, N.Y.). The EL characteristics of all the fabricated devices were evaluated using a constant current source (KEITHLEY 2400 SourceMeter, made by Keithley Instruments, Inc., Cleveland, Ohio) and a photometer (PHOTO RESEARCH SpectraScan PR 650, made by Photo Research, Inc., Chatsworth, Calif.) at room temperature. The color was reported using Commission Internationale de l'Eclairage (CIE) coordinates. Operational lifetime of the devices was tested at the room temperature by driving a current of 80 mA/cm$^2$ through the devices.

Example 1

Comparative

The preparation of an OLED is as follows: A ~1.1 mm thick glass substrate coated with a transparent ITO conductive layer was cleaned and dried using a commercial glass scrubber tool. The thickness of ITO is about 25 nm and the sheet resistance of the ITO is about 70 Ω/square. The ITO surface was subsequently treated with oxidative plasma to condition the surface as an anode. The substrate was then transferred into a vacuum deposition chamber for deposition of all other layers on top of the substrate. The following layers were deposited in the following sequence by evaporation from a heated boat under a vacuum of approximately 10$^{-6}$ Torr:

a) an HTL, 75 nm thick, including 4,4'-bis[N-(1-naphthyl)-N-phenylamino]biphenyl (NPB);

b) a LEL, 20 nm thick, including tris(8-hydroxyquinoline) aluminum (Alq);

c) an ETL, 40 nm thick, including Alq; and d) a cathode, approximately 210 nm thick, including Mg:Ag (formed by co-evaporation of about 95 vol % Mg and 5 vol % Ag).

After the deposition of these layers, the device was transferred from the deposition chamber into a dry box (made by VAC Vacuum Atmosphere Company, Hawthorne, Calif.) for encapsulation. The OLED has an emission area of 10 mm$^2$. The device is denoted as: ITO/O$_2$/75 nm NPB/20 nm Alq/40 nm Alq/210 nm Mg:Ag.

Figure 6:
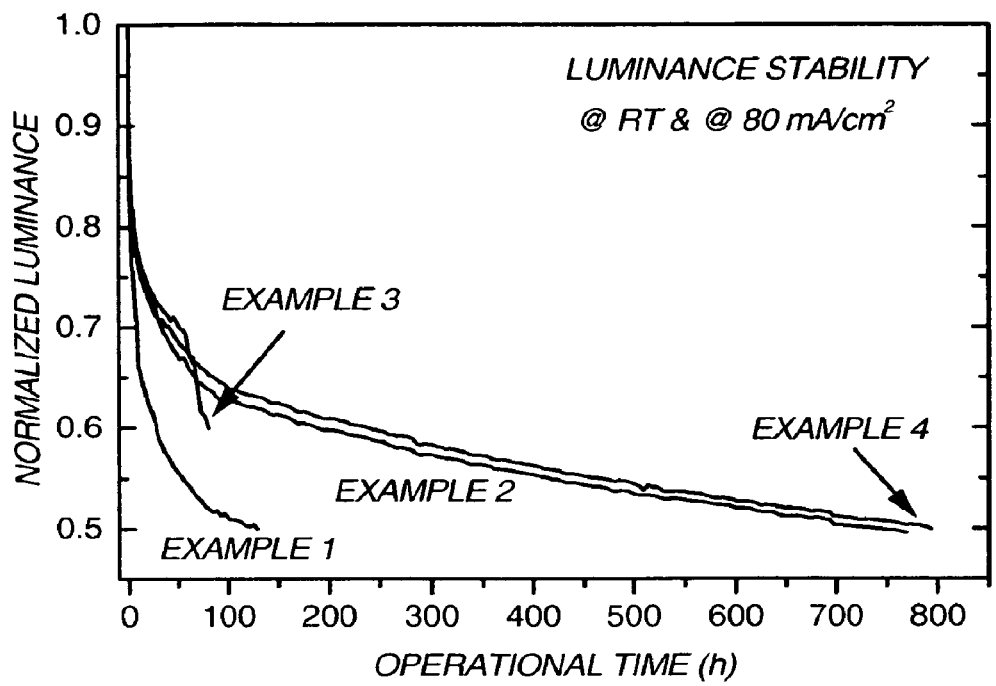
FIG. 6 is a graph showing the normalized luminance vs. operational time of a group of OLEDs tested at the room temperature and at 80 mA/cm$^2$.
Figure 7:
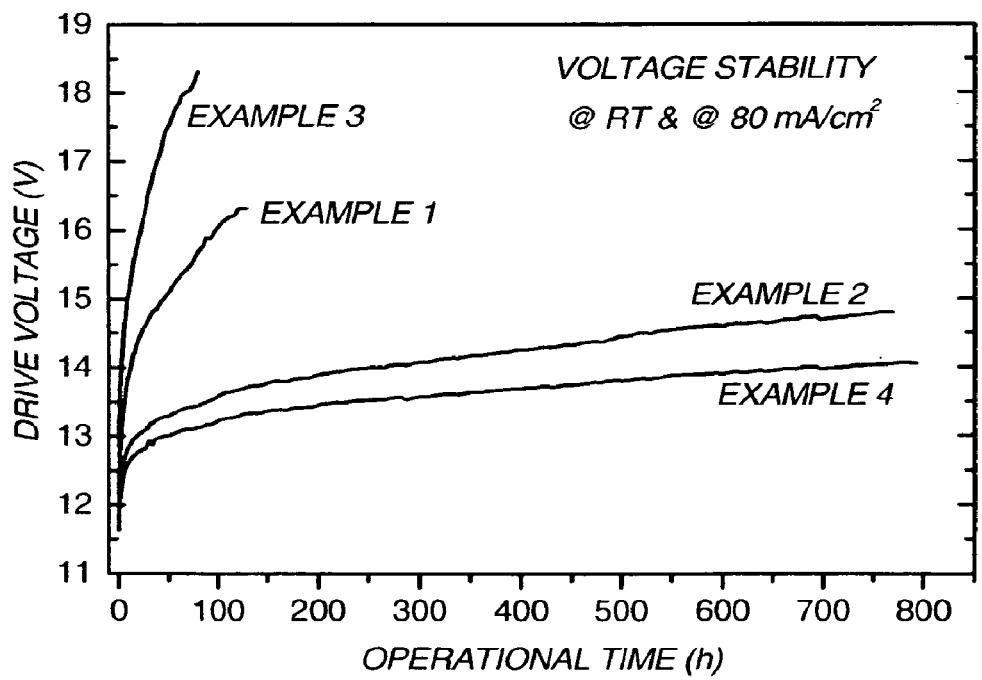
FIG. 7 is a graph showing the drive voltage vs. operational time of a group of OLEDs tested at the room temperature and at 80 mA/cm$^2$.

This OLED requires a drive voltage of about 6.6 V to pass 20 mA/cm$^2$. Under this test condition, the device has a luminance of 472 cd/m$^2$, and a luminous efficiency of about 2.4 cd/A. Its color coordinates are CIE$_x$=0.326 and CIE$_y$=0.546, and its emission peak is at 526 nm. The operational lifetime was measured as T$_{50}$ (RT; 80 mA/cm$^2$) (i.e. the time at which the luminance has fallen to 50% of its initial value after being operated at the room temperature and at 80 mA/cm$^2$). Its T$_{50}$(RT; 80 mA/cm$^2$) is about 128 hours. The voltage rise within the operational lifetime (ΔV) is about 4.0 V. The EL performance data are summarized in Table 1, its normalized luminance vs. operational time, is shown in FIG. 6, and its drive voltage vs. operational time, tested at RT and at 80 mA/cm², is shown in FIG. 7.

The operational lifetime testing in the present invention is an accelerating testing. If this device were to test at the room temperature and at 20 mA/cm², the operational lifetime would be increased by a factor of 8~11. This device has short operational lifetime and high voltage rise.

Example 2

Comparative

Another OLED was constructed as the same as that in Example 1, except that a layer of CFx, 1 nm thick, was deposited on the oxidative plasma treated ITO surface by decomposing $CHF_3$ gas in an RF plasma treatment chamber before the deposition of the HTL in another evaporation chamber. The device is denoted as: $ITO/O_2/1$ nm CFx/75 nm NPB/20 nm Alq/40 nm Alq/210 nm Mg:Ag.

This OLED requires a drive voltage of about 6.2 V to pass 20 mA/cm². Under this test condition, the device has a luminance of 482 cd/m², and a luminous efficiency of about 2.4 cd/A. Its color coordinates are $CIE_x$=0.326 and $CIE_y$=0.548, and its emission peak is at 526 nm. Its $T_{50}$ (RT; 80 mA/cm2) is about 766 hours. The voltage rise within the operational lifetime ($\Delta V$) is about 3.0 V. The EL performance data are summarized in Table 1, its normalized luminance vs. operational time, is shown in FIG. 6, and its drive voltage vs. operational time, tested at RT and at 80 mA/cm², is shown in FIG. 7.

In this device, as an electrode modification layer or a hole-injecting layer, (CFx)n layer can dramatically improve the operational lifetime and reduce the voltage rise within the operational lifetime. However, as mentioned before, it needs a separated plasma deposition chamber to prepare this (CFx)n layer and it is difficult to form this (CFx)n layer with identical thickness from one substrate to another substrate causing drive voltage deviation from one device to another device.

Example 3

Comparative

Yet another OLED was constructed as the same as that in Example 1, except that a layer of $C_{60}$, 2 nm thick, was deposited on the oxidative plasma treated ITO surface by thermal evaporation followed by the deposition of the HTL in the same evaporation chamber. The device is denoted as: $ITO/O_2/2$ nm $C_{60}$/75 nm NPB/20 nm Alq/40 nm Alq/210 nm Mg:Ag.

This OLED requires a drive voltage of about 7.3 V to pass 20 mA/cm². Under this test condition, the device has a luminance of 553 cd/m², and a luminous efficiency of about 2.8 cd/A. Its color coordinates are $CIE_x$=0.327 and $CIE_y$=0.547, and its emission peak is at 526 nm. Its $T_{50}$ (RT; 80 mA/cm2) is less than 100 hours. The voltage rise within the operational lifetime ($\Delta V$) is higher than 5.0 V. The EL performance data are summarized in Table 1, its normalized luminance vs. operational time, is shown in FIG. 6, and its drive voltage vs. operational time, tested at RT and at 80 mA/cm², is shown in FIG. 7.

In this device, as an electrode modification layer or a hole-injecting layer, the $C_{60}$ layer causes high drive voltage, short lifetime, and very high voltage rise. The results indicate that $C_{60}$ layer may not be a suitable electrode modification layer in organic devices.

Example 4

Inventive

An OLED, in accordance with the present invention, was constructed as the same as that in Example 1, except that a layer of $C_{60}F_{36}$, 2 nm thick, was deposited on the oxidative plasma treated ITO surface by thermal evaporation followed by the deposition of the HTL in the same evaporation chamber. The device is denoted as: $ITO/O_2/2$ nm $C_{60}F_{36}$/75 nm NPB/20 nm Alq/40 nm Alq/210 nm Mg:Ag.

This OLED requires a drive voltage of about 6.3 V to pass 20 mA/cm². Under this test condition, the device has a luminance of about 477 cd/m², and a luminous efficiency of about 2.4 cd/A. Its color coordinates are $CIE_x$=0.326 and $CIE_y$=0.547, and its emission peak is at 526 nm. Its $T_{50}$ (RT; 80 mA/cm2) is about 790 hours. The voltage rise within the operational lifetime ($\Delta V$) is about 2.0 V. The EL performance data are summarized in Table 1, its normalized luminance vs. operational time, is shown in FIG. 6, and its drive voltage vs. operational time, tested at RT and at 80 mA/cm², is shown in FIG. 7.

In this device, as an electrode modification layer, $C_{60}F_{36}$ layer can dramatically improve the operational lifetime and reduce the voltage rise within the operational lifetime. Comparing with the device in Example 2 having a (CFx)n layer, both devices have similar operational lifetime. However, the device with a $C_{60}F_{36}$ layer in Example 4 has lower voltage rise within the operational lifetime. Moreover, unlike the (CFx)n layer which is formed using plasma treatment, the $C_{60}F_{36}$ layer can be formed on the anode using thermal evaporation method.

TABLE 1

| Example(Type) (EL measured @ RT and 20 mA/cm²) | Voltage (V) | Luminance (cd/m²) | Luminous Efficiency (cd/A) | CIE x (1931) | CIE y (1931) | $T_{50}$(RT; 80 mA/cm²) (Hrs) | Voltage Rise ($\Delta V$) (V) |
|---|---|---|---|---|---|---|---|
| 1 (Comparative) | 6.6 | 472 | 2.4 | 0.326 | 0.546 | 128 | 4.0 |
| 2 (Comparative) | 6.2 | 482 | 2.4 | 0.326 | 0.548 | 766 | 3.0 |
| 3 (Comparative) | 7.3 | 553 | 2.8 | 0.326 | 0.547 | <100 | >5.0 |
| 4 (Inventive) | 6.3 | 477 | 2.4 | 0.326 | 0.547 | 791 | 2.0 |

The invention has been described in detail with particular reference to certain preferred OLED embodiments thereof, but it will be understood that variations and modifications can be effected within the spirit and scope of the invention.

PARTS LIST

100 OLED
110 substrate
120.1 anode
120.2 electrode modification layer
130 hole-injecting layer (HIL)
140 hole-transporting layer (HTL)
150 light-emitting layer (LEL)
160 electron-transporting layer (ETL)
170 electron-injecting layer (EIL)
180 cathode
191 electrical conductors
192 voltage/current source
200 OLED
300 organic thin film transistor (OTFT)
310 substrate
320 gate
330 dielectric layer
350 active layer
360.1 electrode modification layer
360.2 source electrode
360.3 drain electrode
400 organic solar cell
410 substrate
420.1 anode
420.2 electrode modification layer
440 hole-transporting layer (HTL)
450 active layer
460 electron-transporting layer (ETL)
470 electron-injecting layer (EIL)
480 cathode
500 organic photodetector

The invention claimed is:

1. A thin-film transistor comprising in the order:
   a. a substrate;
   b. a gate electrode;
   c. a dielectric layer;
   d. at least one active layer which is an organic semiconductor layer;
   e. an electrode modification layer including a fluorocarbon compound selected from the materials having a chemical structure of $(c_xF_y)_n$ wherein the "x", "y" and "n" are integers, and wherein $1<x\leq70$, $1<y\leq50$ and $n\geq1$; and
   f. a drain and a source electrode, both in contact with the electrode modification layer.

2. The thin-film transistor of claim 1 where the fluorocarbon compound is made of small molecule fluorocarbon compounds selected from $C_6F_{12}$, $C_6F_{14}$, $C_7F_{14}$, $C_7F_{16}$, $C_{11}F_{20}$, $C_{12}F_{10}$, $C_{13}F_{28}$, $C_{15}H_{32}$, $C_{20}F_{42}$, $C_{24}F_{50}$, $C_{60}F_{18}$, $C_{60}F_{22}$, $C_{60}F_{30}$, $C_{60}F_{36}$, $C_{60}F_{40}$, $C_{60}F_{42}$, $C_{60}F_{48}$, $C_{70}F_{11}$ or $C_{70}F_{15}$.

3. The thin-film transistor of claim 2 where the fluorocarbon compound is made of small molecule fluorocarbon compounds selected from $C_{60}F_{18}$, $C_{60}F_{22}$, $C_{60}F_{30}$, $C_{60}F_{36}$, $C_{60}F_{40}$, $C_{60}F_{42}$, $C_{60}F_{48}$, $C_{70}F_{11}$ or $C_{70}F_{15}$.

4. The thin-film transistor of claim 3 where the fluorocarbon compound is $C_{60}F_{36}$.

5. The thin-film transistor of claim 1 where the electrode modification layer has a thickness of 0.1 to 10 nm.

* * * * *